United States Patent
Yamanaka et al.

(10) Patent No.: US 11,681,388 B2
(45) Date of Patent: Jun. 20, 2023

(54) DISPLAY DEVICE

(71) Applicant: SHARP KABUSHIKI KAISHA, Sakai (JP)

(72) Inventors: Masaki Yamanaka, Sakai (JP); Yi Sun, Sakai (JP); Takao Saitoh, Sakai (JP); Masahiko Miwa, Sakai (JP); Yohsuke Kanzaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 106 days.

(21) Appl. No.: 17/603,305

(22) PCT Filed: Apr. 19, 2019

(86) PCT No.: PCT/JP2019/016892
§ 371 (c)(1),
(2) Date: Oct. 12, 2021

(87) PCT Pub. No.: WO2020/213172
PCT Pub. Date: Oct. 22, 2020

(65) Prior Publication Data
US 2022/0206622 A1  Jun. 30, 2022

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0445* (2019.05); *G06F 3/0446* (2019.05);
(Continued)

(58) Field of Classification Search
CPC ...... G06F 3/041–047; G06F 2203/041–04114; G06F 3/0412
(Continued)

(56) References Cited

U.S. PATENT DOCUMENTS

| 2016/0370901 A1 | 12/2016 | Sutou |
| 2016/0370916 A1 | 12/2016 | Hashimoto |
| 2018/0197924 A1 | 7/2018 | Tada et al. |

FOREIGN PATENT DOCUMENTS

| JP | 2014164327 A | 9/2014 |
| JP | 2015069611 A | 4/2015 |

(Continued)

*Primary Examiner* — Sanjiv D. Patel
(74) *Attorney, Agent, or Firm* — ScienBiziP, P.C.

(57) ABSTRACT

A display device includes a plurality of upper layer electrodes including a first upper layer electrode and a second upper layer electrode electrically separated from the first upper layer electrode, and a lower layer electrode provided in common with the first upper layer electrode and a second upper layer electrode and overlapping with the first upper layer electrode and the second upper layer electrode via an insulating film. The first upper layer electrode includes a first protrusion protruding toward the second upper layer electrode, and the second upper layer electrode includes a second protrusion protruding toward the first upper layer electrode. The lower layer electrode is provided with a wide portion having a width greater than those of the first protrusion and the second protrusion, the wide portion overlapping at least with a gap between the first protrusion and the second protrusion.

19 Claims, 13 Drawing Sheets

(51) Int. Cl.
*H10K 50/84* (2023.01)
*H10K 59/40* (2023.01)
*H10K 59/131* (2023.01)

(52) U.S. Cl.
CPC ......... *H10K 50/841* (2023.02); *H10K 59/131* (2023.02); *H10K 59/40* (2023.02); *G06F 2203/04107* (2013.01)

(58) Field of Classification Search
CPC ...... G06F 3/044; G06F 3/0443; G06F 3/0445; G06F 3/0446; G06F 3/0448; G06F 2203/04111; H10K 59/40; G06V 40/1318
See application file for complete search history.

(56) References Cited

FOREIGN PATENT DOCUMENTS

| | | | |
|---|---|---|---|
| JP | 2015191560 | A | 11/2015 |
| JP | 2018112859 | A | 7/2018 |

(a)

(b)

DISPLAY DEVICE

TECHNICAL FIELD

The disclosure relates to a display device.

BACKGROUND ART

PLT 1 discloses a touch panel including a sensing electrode and a shield electrode.

CITATION LIST

Patent Literature

PTL 1: JP 2014-164327 A (published on Sep. 8, 2014).

SUMMARY

Technical Problem

In the touch panel layer having two upper layer electrodes adjacent to each other (a first upper layer electrode and a second upper layer electrode) overlapped with a lower layer electrode via an insulating film, the two upper layer electrodes may be short-circuited by a residue of an upper layer (metal layer) that is formed at a step-like portion of the insulating film.

Solution to Problem

A display device according to an aspect of the disclosure is a display device including a thin film transistor layer, a light-emitting element including a first electrode, a function layer, and a second electrode, a sealing layer, and a touch panel layer including a lower layer electrode and a plurality of upper layer electrodes, wherein the plurality of upper layer electrodes include a first upper layer electrode and a second upper layer electrode adjacent to the first upper layer electrode and electrically separated from the first upper layer electrode, the lower layer electrode is provided in common with the first upper layer electrode and the second upper layer electrode and overlaps with the first upper layer electrode and the second upper layer electrode via an insulating film, the first upper layer electrode includes a first protrusion protruding toward the second upper layer electrode, and the second upper layer electrode includes a second protrusion protruding toward the first upper layer electrode, the first protrusion and the second protrusion face each other with a gap therebetween, and the lower layer electrode is provided with a wide portion having a width greater than those of the first protrusion and the second protrusion, the wide portion overlapping at least with the gap.

A display device according to another aspect of the disclosure is a display device including a thin film transistor layer, a light-emitting element including a first electrode, a function layer, and a second electrode, a sealing layer, and a touch panel layer including a lower layer electrode and a plurality of upper layer electrodes, wherein the plurality of upper layer electrodes include a first upper layer electrode and a second upper layer electrode adjacent to the first upper layer electrode and electrically separated from the first upper layer electrode, the lower layer electrode is provided in common with the first upper layer electrode and the second upper layer electrode and overlaps with the first upper layer electrode and the second upper layer electrode via an insulating film, the first upper layer electrode includes a first protrusion protruding toward the second upper layer electrode, and the second upper layer electrode includes a second protrusion protruding toward the first upper layer electrode, the first protrusion and the second protrusion facing each other with a gap therebetween, and the lower layer electrode includes a first side face overlapping with the first protrusion and not overlapping with the second protrusion and a second side face overlapping with the second protrusion and not overlapping with the first protrusion.

Advantageous Effects of Disclosure

According to an aspect of the disclosure, a short circuit of the first upper layer electrode and the second upper layer electrode can be prevented.

DESCRIPTION OF EMBODIMENTS

Figure 1:
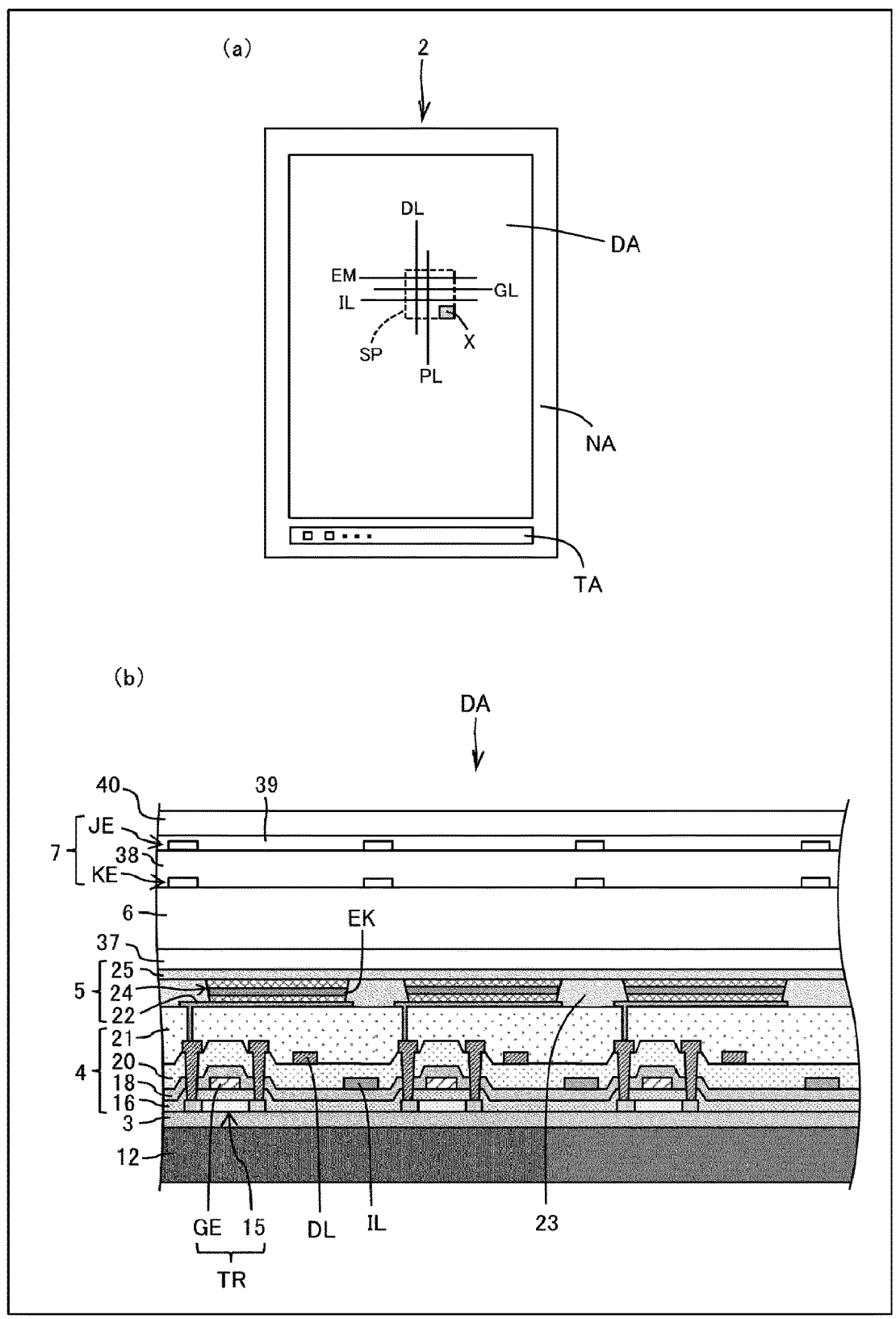
FIG. 1(a) is a schematic plan view illustrating a configuration of a display device according to a first embodiment.
FIG. 1(b) is a cross-sectional view illustrating the configuration of the display device according to the first embodiment.

FIG. 1(a) is a schematic plan view illustrating a configuration of a display device according to a first embodiment, and FIG. 1(b) is a cross-sectional view illustrating the configuration of the display device according to the first embodiment. The display device 2 includes, on a base material 12, a barrier layer 3, a thin film transistor layer 4, a top-emitting type light-emitting element layer 5, an interlayer insulating film 37, a sealing layer 6, a touch panel layer 7, and a function film 40, the barrier layer 3, the thin film transistor layer 4, the top-emitting type light-emitting element layer 5, the interlayer insulating film 37, the sealing layer 6, the touch panel layer 7, and the function film 40 being layered in this order, and further included a plurality of subpixels SP formed in a display region DA. A terminal section TA for mounting an electronic circuit board (such as, IC chip or FPC) is formed on a frame region NA surrounding the display region DA. The touch panel layer 7 may be of an on-cell type formed on the sealing layer 6, or may be of a type that is adhered onto the sealing layer 6.

The base material 12 may be a glass substrate or a flexible substrate including a resin film such as polyimide film. The flexible substrate can also be formed by a two-layer resin film and an inorganic insulating film sandwiched therebetween. A film such as a PET film may be applied to a lower face of the base material 12.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

As illustrated in FIG. 1(b), the thin film transistor layer 4 includes a semiconductor layer (including a semiconductor film 15) as an upper layer overlying the barrier layer 3; an inorganic insulating film 16 (a gate insulating film) as an upper layer overlying the semiconductor layer; a first metal layer (including a gate electrode GE) as an upper layer overlying the inorganic insulating film 16; an inorganic insulating film 18 as an upper layer overlying the first metal layer; a second metal layer (including an initialization power source line IL) as an upper layer overlying the inorganic insulating film 18; an inorganic insulating film 20 as an upper layer overlying the second metal layer; a third metal layer (including a data signal line DL) as an upper layer overlying the inorganic insulating film 20; and a flattening film 21 as an upper layer overlying the third metal layer.

The semiconductor film 15 is formed from, for example, amorphous silicon, low-temperature polysilicon (LTPS), or oxide semiconductor, and a thin film transistor TR is formed including the gate electrode GE and the semiconductor film 15. The thin film transistor TR in the drawing is of a bottom gate structure, but is not limited thereto.

In the display region DA, a light-emitting element X and a pixel circuit are provided for each subpixel SP, and in the thin film transistor layer 4, a pixel circuit and a wiring line connected thereto are formed. Examples of the wiring line connected to the pixel circuit include, for example, a scanning signal line GL and a light emission control line EM formed in the first metal layer; the initialization power source line IL formed in the second metal layer; the data signal line DL and a high-voltage side power source line PL formed in the third metal layer. The pixel circuit includes: a drive transistor that controls current of the light-emitting element X, a write transistor connected to the scanning signal line GL, a light emission control transistor connected to the light emission control line, and the like.

The first metal layer, the second metal layer, and the third metal layer are each formed from a single-layer film or a multi-layered film of metal, the metal including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic resin.

The light-emitting element layer 5 includes: a first electrode (anode) 22 formed on the flattening film 21; an edge cover film 23 having insulating properties and covering an edge of the first electrode 22; a function layer 24 as an upper layer overlying the edge cover film 23; and a second electrode (cathode) 25 as an upper layer overlying the function layer 24. The edge cover film 23 is formed by applying an organic material such as a polyimide or an acrylic resin and then patterning the organic material by photolithography, for example.

In the light-emitting element layer 5, a plurality of the light-emitting elements X emitting light in a plurality of colors are formed, and each light-emitting element includes, as an island shape, the first electrode 22, the function layer 24, and the second electrode 25. The second electrode 25 is a solid-like common electrode in common to a plurality of light-emitting elements.

The light-emitting element X may be, for example, an organic light-emitting diode (OLED) including an organic layer as a light-emitting layer, or may be a quantum dot light emitting diode (QLED) including a quantum dot layer as the light-emitting layer.

For example, the function layer 24 is formed by layering: a hole injection layer, a hole transport layer, a light-emitting layer EK, an electron transport layer, and an electron injection layer in this order, with the hole injection layer being the bottommost. The light-emitting layer is formed into an island shape at an opening of the edge cover film 23 (on a subpixel-by-subpixel basis) by vapor deposition or an ink-jet method or a photolithographic method. Other layers are formed in an island shape or a solid-like shape (common layer). A configuration is also possible in which one or more layers are not formed among the hole injection layer, the hole transport layer, the electron transport layer, and the electron injection layer.

The first electrode 22 is a light reflective electrode formed by layering Indium Tin Oxide (ITO) and silver (Ag) or an alloy containing Ag, for example. The second electrode 25 (cathode electrode) is formed from a thin metal film such as, for example, a magnesium silver alloy film and has optical transparency.

In a case where the light-emitting element X is an OLED, positive holes and electrons recombine inside the light-emitting layer EK in response to a drive current between the first electrode 22 and the second electrode 25, and light is emitted when the excitons generated in this manner transition to a ground state. In a case where the light-emitting element X is a QLED, positive holes and electrons recombine inside the light-emitting layer EK in response to a drive current between the first electrode 22 and the second electrode 25, and light is emitted when the excitons generated in this manner transition from the conduction band of the quantum dot to the valence band. The interlayer insulating film 37 can be formed, for example, from a silicon nitride film, a silicon oxide film, an organic film, or the like.

The sealing layer 6 is a layer that prevents penetration of foreign matters such as water, oxygen, or the like into the light-emitting element layer 5, and can be formed, for example, from two inorganic sealing films and an organic film formed therebetween.

The touch panel layer 7 includes a lower layer electrode KE, an insulating film 38, a plurality of upper layer electrodes JE, and an insulating film 39, the lower layer electrode KE, the insulating film 38, the plurality of upper layer electrodes JE, and the insulating film 39 being formed in this order. The upper layer electrode JE includes, for example, a layered film including titanium and aluminum, or a single-layer film of molybdenum or a single-layer film of titanium. The lower layer electrode KE includes, for example, a layered film including titanium and aluminum, or a single-layer film of molybdenum or a single-layer film of titanium. The function film 40 has an optical element function, a protection function, or the like, for example.

First Embodiment

Figure 2:
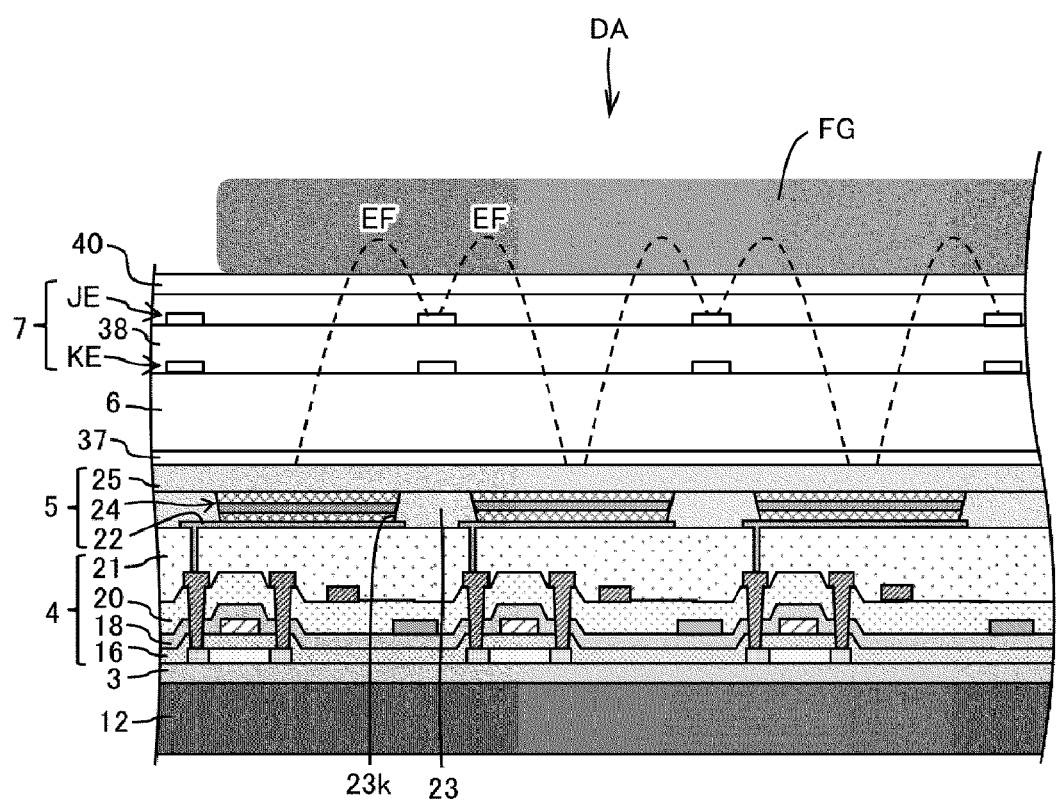
FIG. 2 is a cross-sectional view illustrating a principle of a touch panel.

FIG. 2 is a cross-sectional view illustrating a sensing principle of a touch panel. As illustrated in FIG. 2, an electric field EF formed between the second electrode 25 and the upper layer electrode JE varies depending on a contacting object FG (for example, a human finger), allowing for identification of a touch location in the display area DA by periodically acquiring potentials of the plurality of upper layer electrodes JE in the display region DA.

In the light-emitting element layer 5, an opening 23k exposing an upper face of the first electrode 22 is provided in the edge cover film 23 covering an edge of the first electrode 22, while the plurality of upper layer electrodes JE are disposed not to overlap with the opening 23k. This is because an upper portion of the opening 23k is a light-emitting region of the light-emitting element X, and when the upper layer electrode JE which is light-blocking and the opening 23k overlap, the usage efficiency of light decreases.

FIG. 3(a) is a plan view illustrating a configuration of the upper layer electrode, and FIGS. 3(b) and 3(c) are plan views illustrating a relationship between grid wiring lines of the upper layer electrode and subpixels. FIG. 4(a) is a plan view illustrating a configuration of the lower layer electrode, and FIGS. 4(b) and 4(c) are plan views illustrating a relationship between grid wiring lines of the lower layer electrode and the subpixels.

Figure 3:
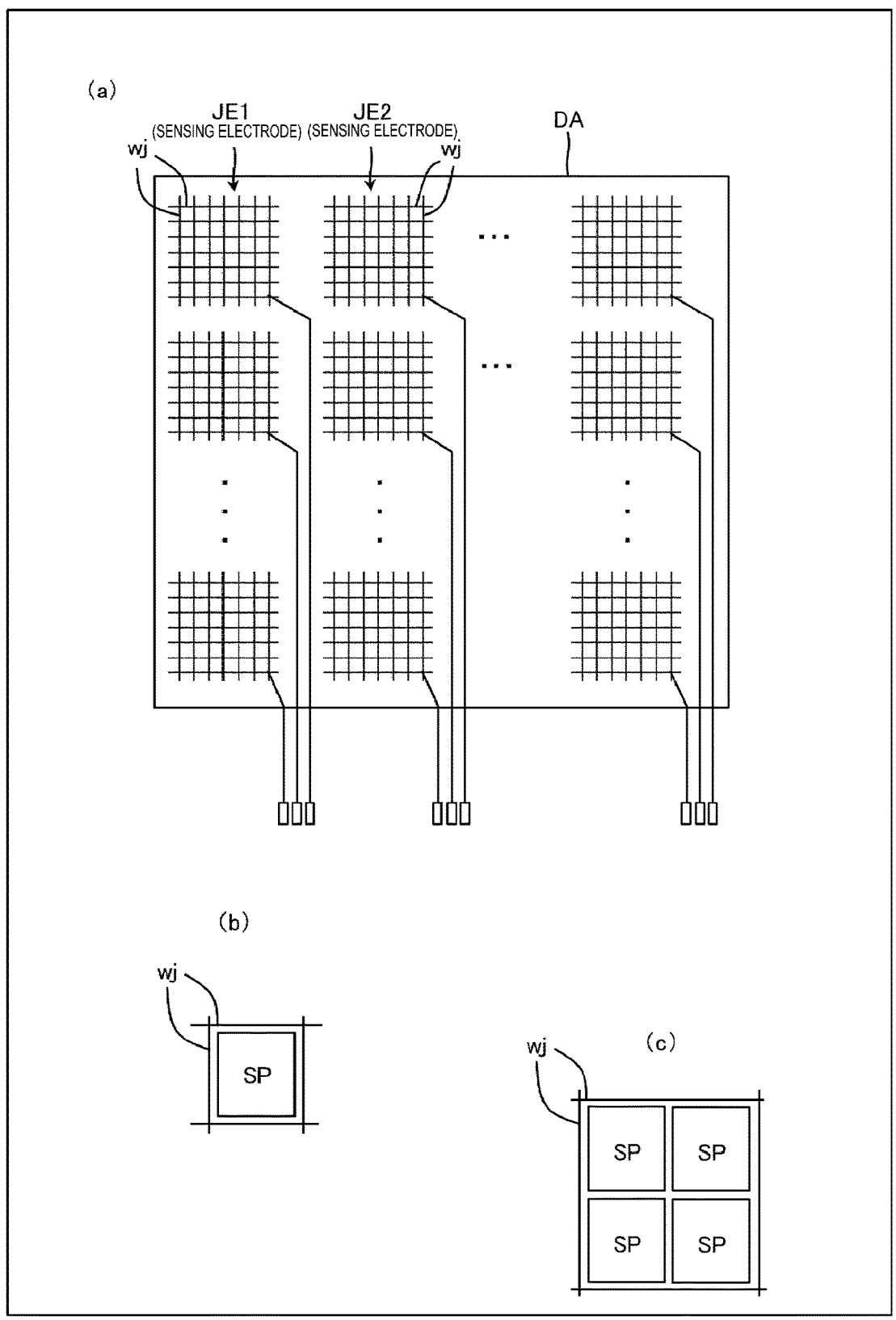
FIG. 3(a) is a plan view illustrating a configuration of an upper layer electrode.
FIGS. 3(b) and 3(c) are plan views illustrating a relationship between grid wiring lines of an upper layer electrode and subpixels.
Figure 4:
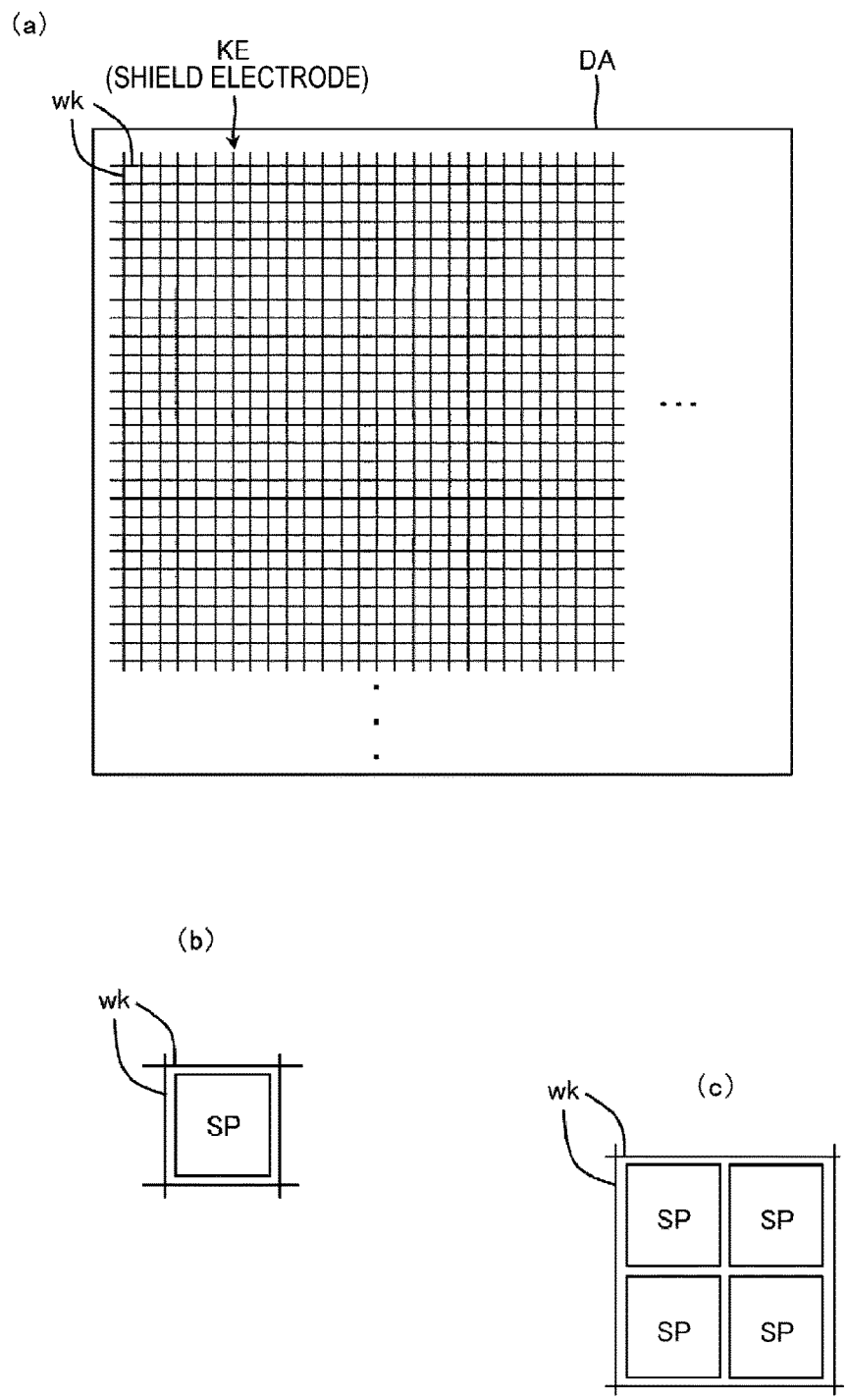
FIG. 4(a) is a plan view illustrating a configuration of a lower layer electrode.
FIGS. 4(b) and 4(c) are plan views illustrating a relationship between grid wiring lines of a lower layer electrode and subpixels.

As illustrated in FIGS. 3 and 4, the touch panel layer 7 in FIGS. 1 and 2 includes a first upper layer electrode JE1 and a second upper layer electrode JE2 that function as sensing electrodes, and the lower layer electrode KE that overlaps with the first upper layer electrode JE1 and the second upper layer electrode JE2 and functions as a shield electrode.

As illustrated in FIG. 3(a), the first upper layer electrode JE1 and the second upper layer electrode JE2 are adjacent to each other and electrically separated. Each of the first upper layer electrode JE1 and the second upper layer electrode JE2 is a mesh electrode, and is formed from a grid wiring line wj having a uniform line width.

As illustrated in FIG. 4(a), the lower layer electrode KE is provided in common with the first upper layer electrode JE1 and the second upper layer electrode JE2. The lower layer electrode KE is a mesh electrode that overlaps with the first upper layer electrode JE1 and the second upper layer electrode JE2, and is formed from a grid wiring line wk. Although not illustrated, the grid wiring line wk includes a reference portion having the same width as that of the grid wiring line wj of the first upper layer electrode JE1 and the second upper layer electrode JE2 and a wide portion having its line width locally made broad (described later).

In the configuration illustrated in FIG. 3(b) and FIG. 4(b), one subpixel SP is disposed in each grid of the grid wiring lines wj, wk in plan view, and each of the first upper layer electrode JE1 and the second upper layer electrode JE2 is provided in common with the plurality of subpixels SP.

In the configuration illustrated in FIG. 3(c) and FIG. 4(c), the plurality of subpixels SP are disposed in each grid of the grid wiring lines wj, wk in plan view, and each of the first upper layer electrode JE1 and the second upper layer electrode JE2 is provided in common with the plurality of subpixels SP.

FIG. 5(a) is a plan view illustrating the configuration of the display device according to the first embodiment, FIG. 5(b) is a cross-sectional view taken along a line b-b of FIG. 5(a), FIG. 5(c) is a cross-sectional view taken along a line c-c of FIG. 5(a), FIG. 5(d) is a cross-sectional view taken along a line d-d of FIG. 5(a) (a cross-sectional view including one edge of the wide portion), and FIG. 5(e) is a cross-sectional view taken along a line e-e of FIG. 5(a) (a cross-sectional view including the other edge of the wide portion).

Figure 5:
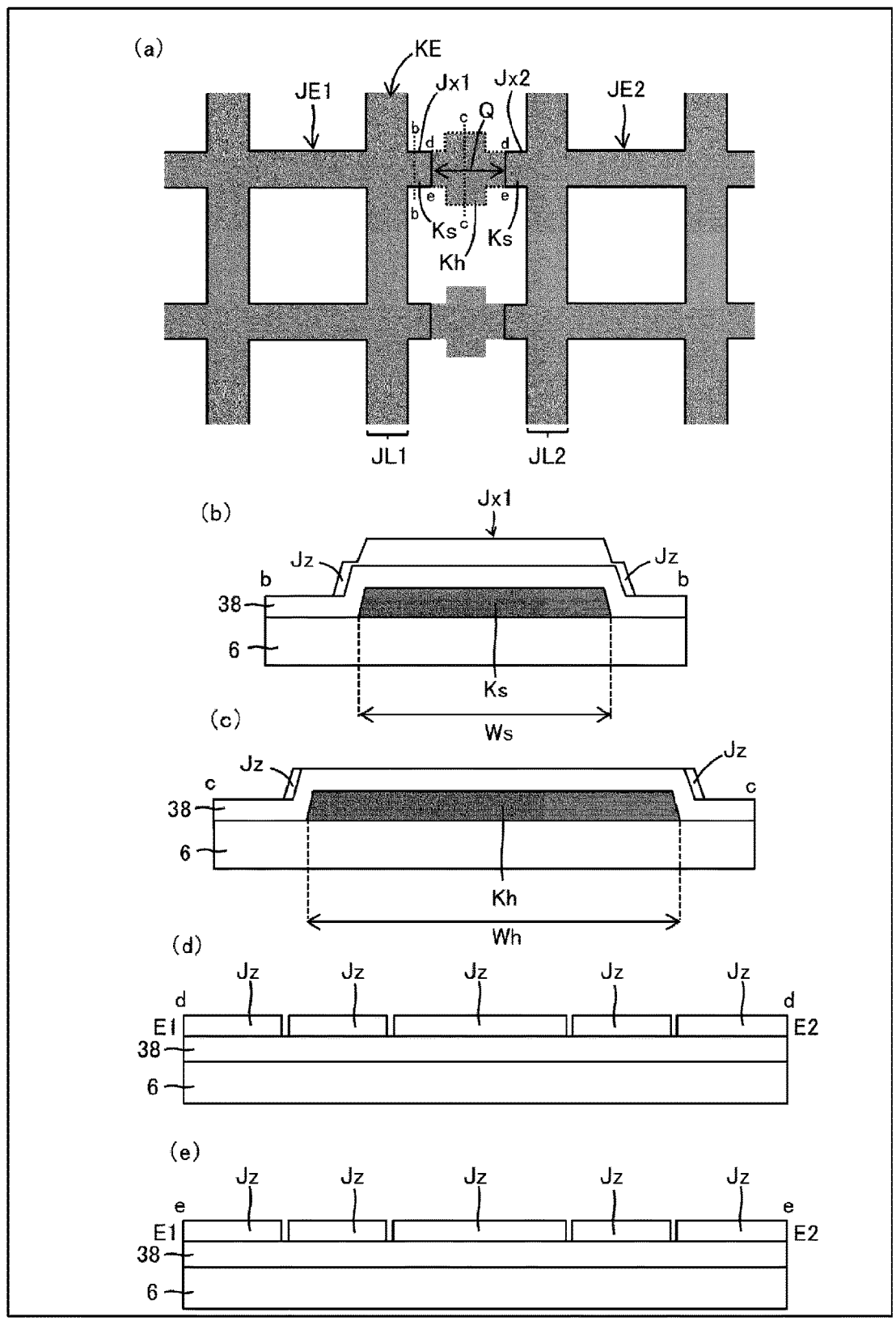
FIG. 5(a) is a plan view illustrating the configuration of the display device according to the first embodiment.
FIG. 5(b) is a cross-sectional view taken along a line b-b of FIG. 5(a)
FIG. 5(c) is a cross-sectional view taken along a line c-c of FIG. 5(a)
FIG. 5(d) is a cross-sectional view taken along a line d-d of FIG. 5(a)
FIG. 5(e) is a cross-sectional view taken along a line e-e of FIG. 5(a).

As shown in FIG. 5, the first upper layer electrode JE1 includes a first protrusion Jx1 protruding toward the second upper layer electrode JE2, and the second upper layer electrode JE2 includes a second protrusion Jx2 protruding toward the first upper layer electrode JE1. Specifically, the first upper layer electrode JE1 includes a first wiring line JL1 and the second upper layer electrode JE2 includes a second wiring line JL2, the first wiring line JL1 and the second wiring line JL2 extending in the same direction and facing each other, the first protrusion Jx1 protrudes from the first wiring line JL1 toward the second wiring line JL2, and the second protrusion Jx2 protrudes from the second wiring line JL2 toward the first wiring line JL1, and the first protrusion Jx1 and the second protrusion Jx2 face each other with a gap Q therebetween. The first wiring line JL1, the second wiring line JL2, the first protrusion Jx1, and the second protrusion Jx2 are end portions of the grid wiring line wj in FIG. 3.

Regarding widths of the lower layer electrode KE (line widths of the grid wiring line), a width Ws of a reference portion Ks that overlaps with the first protrusion Jx1 and a reference portion Ks that overlaps with the second protrusion Jx2 is the same as a width of the first protrusion Jx1 and the second protrusion Jx2 (size in a direction orthogonal to the protruding direction), whereas a width Wh of a wide portion Kh that overlaps with the gap Q between the first protrusion Jx1 and the second protrusion Jx2 is greater than the width of the first protrusion Jx1 and the second protrusion Jx2. The wide portion Kh of the lower layer electrode KE is positioned at the gap Q between the first protrusion Jx1 and the second protrusion Jx2 in plan view.

In the configuration of FIG. 5, as illustrated in FIGS. 5(b) to (e), even when a metal residue Jz is formed at a step-like portion of the insulating film 38 during formation of the first upper layer electrode JE1 and the second upper layer electrode JE2, a metal residue Jz leading to an edge E1 (edge extending in the protruding direction) of the first protrusion Jx1 and a metal residue Jz leading to an edge E2 (edge extending in the protruding direction) of the second protrusion Jx2 are cut at a portion along an edge of the wide portion Kh, and the metal residues Jz are no longer electrically connected. This is because, due to formation of the wide portion Kh, a long leak path due to the metal residues Jz of the first protrusion Jx1 and the second protrusion Jx2 is formed, and a bending part (in particular, four corner portions of the wide portion Kh) in which the metal residue Jz is easily broken is included in the leak path. This allows the prevention of short-circuiting of the first upper layer electrode JE1 and the second upper layer electrode JE2.

Figure 6:
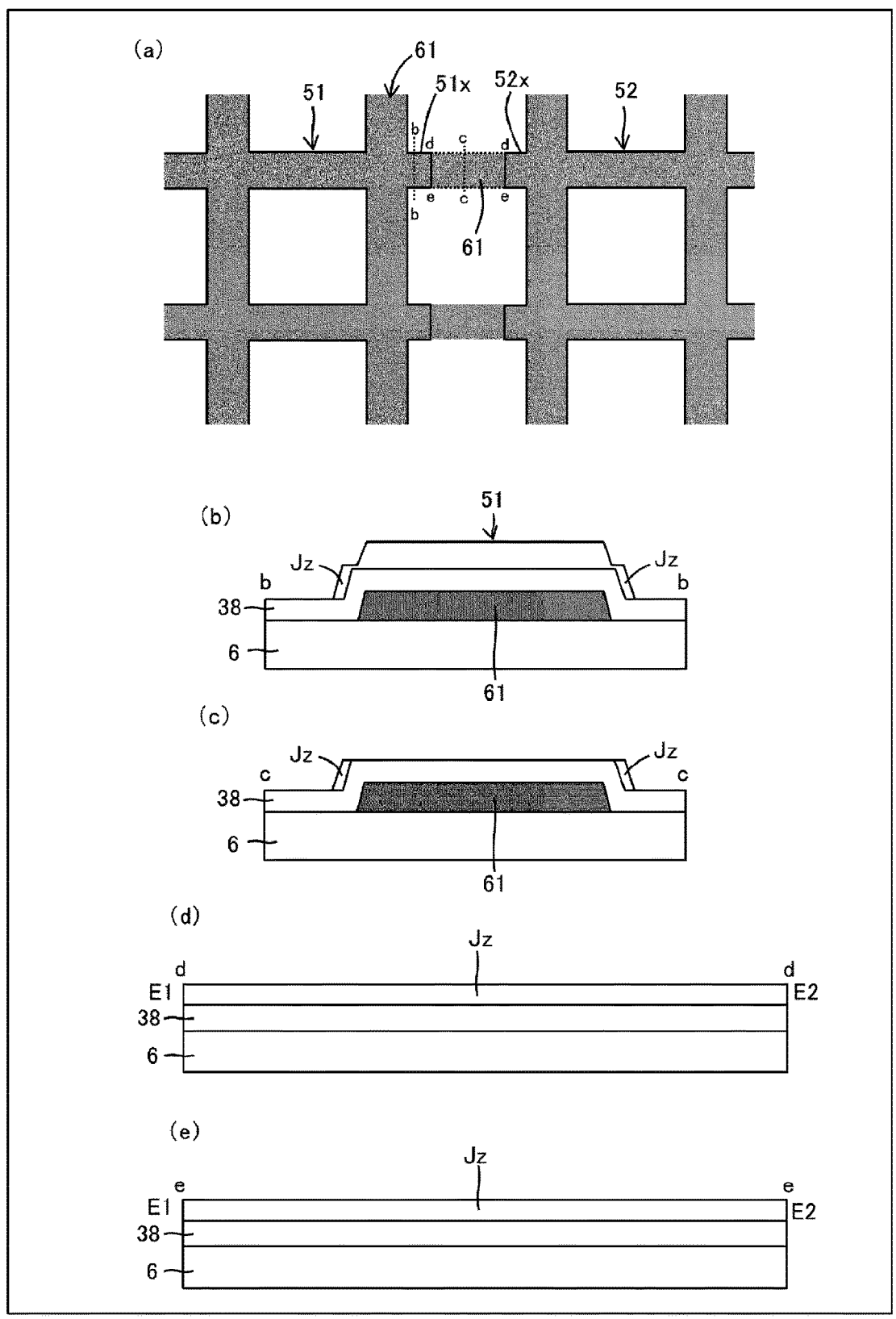
FIG. 6(a) is a plan view illustrating a configuration of a display device according to a comparative example.
FIG. 6(b) is a cross-sectional view taken along a line b-b of FIG. 6(a)
FIG. 6(c) is a cross-sectional view taken along a line c-c of FIG. 6(a)
FIG. 6(d) is a cross-sectional view taken along a line d-d of FIG. 6(a)
FIG. 6(e) is a cross-sectional view taken along a line e-e of FIG. 6(a).

FIG. 6(a) is a plan view illustrating a configuration of a display device according to a comparative example, FIG. 6(b) is a cross-sectional view taken along line a b-b of FIG. 6(a), FIG. 6(c) is a cross-sectional view taken along a line c-c of FIG. 6(a), FIG. 6(d) is a cross-sectional view taken along a line d-d of FIG. 6(a), and FIG. 6(e) is a cross-sectional view taken along a line e-e of FIG. 6(a). When the wide portion Kh that overlaps with a lower layer electrode 61 is not provided as in FIG. 6, the leak path due to the metal residue Jz is short and straight, and thus there is a high risk that the metal residue Jz leading to the edge E1 of a first protrusion 51x and the metal residue Jz leading to the edge E2 of a second protrusion 52x run continuously (electrically connected) without a break.

Figure 7:
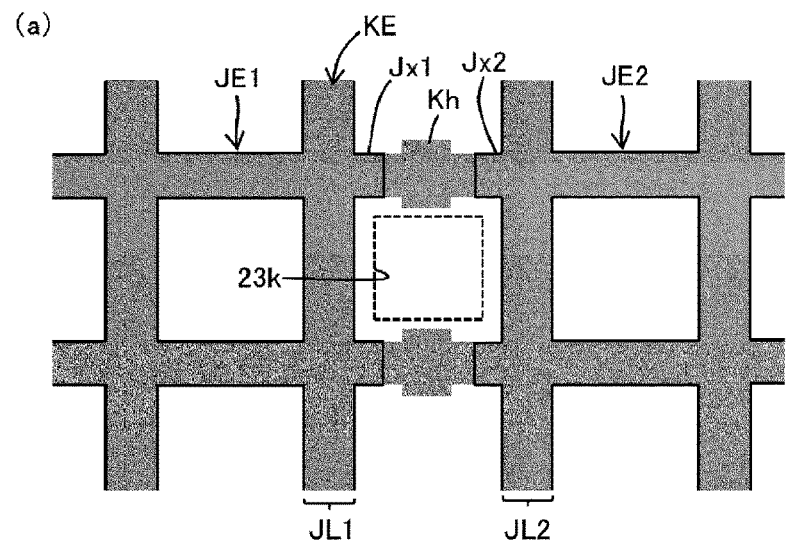
FIG. 7 illustrates plan views illustrating the display device according to the first embodiment.
Figure 7:
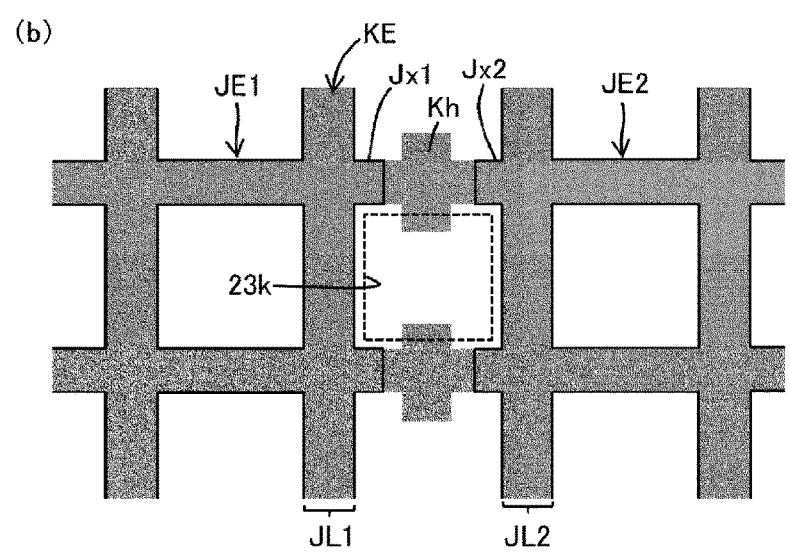

FIG. 7 illustrates plan views illustrating the display device according to the first embodiment. In the first embodiment, as illustrated in FIG. 7(a), the wide portion Kh of the lower layer electrode KE may be configured not to overlap with the opening 23k (corresponding to the light-emitting region of the subpixel) of the edge cover film 23, or as illustrated in FIG. 7(b), the wide portion Kh of the lower layer electrode KE may be configured to overlap with the opening 23k of the edge cover film 23. The lower layer electrode KE is a shield electrode, and thus it can be an electrode with high translucency (for example, a transparent electrode using ITO or the like). In this case, even when the wide portion Kh overlaps with the opening 23k, the wide portion Kh does not interrupt outgoing of the light emitted.

Figure 8:
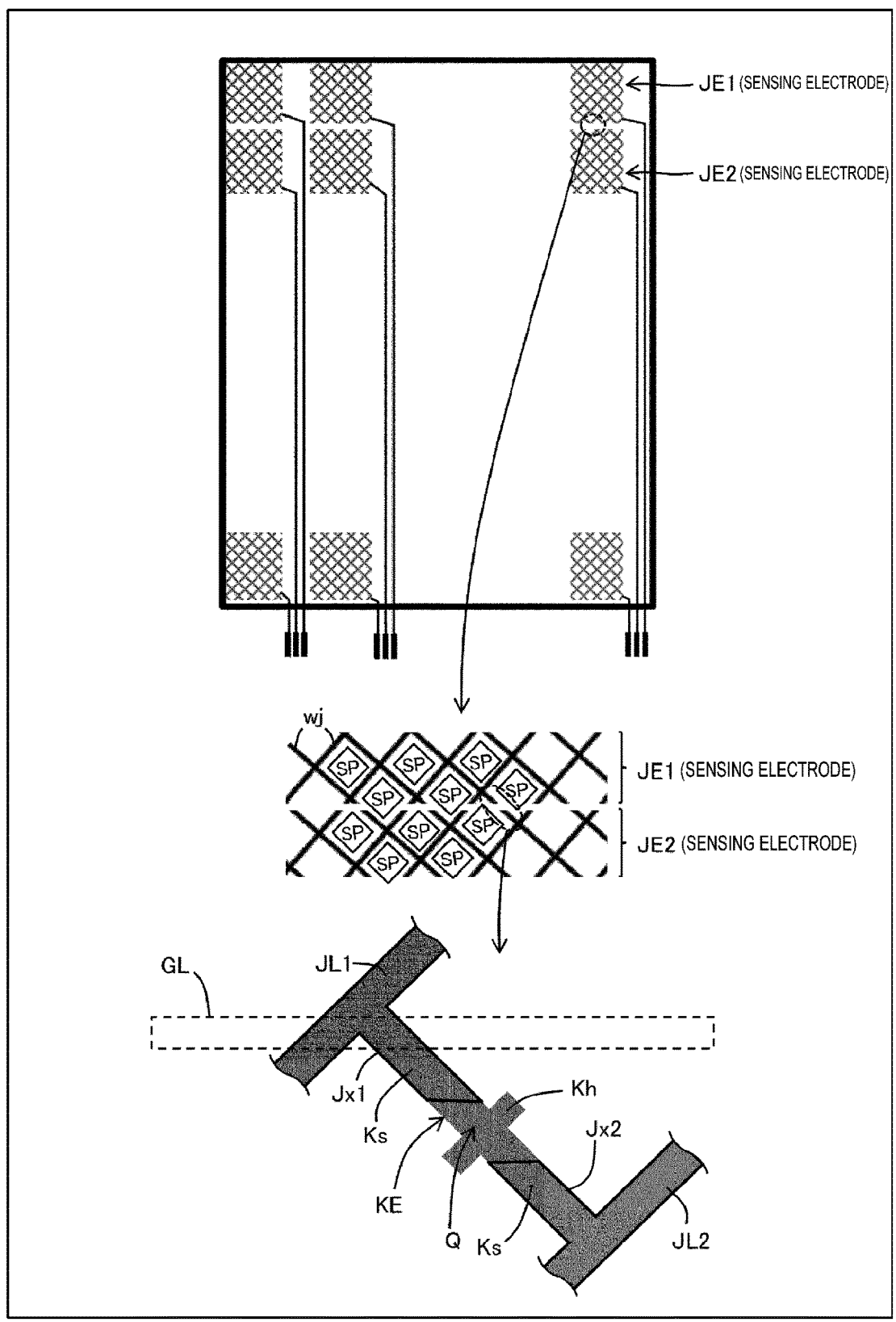
FIG. 8 is an explanatory diagram illustrating another example of the display device according to the first embodiment.

FIG. 8 is an explanatory diagram illustrating another example of the display device according to the first embodiment. In FIG. 3 and the like, the grid wiring lines wj forming the first upper layer electrode JE1 and the second upper layer electode JE2 are configured to be in a parallel or orthogonal relationship with respect to the scanning signal line GL, but are not limited thereto. As illustrated in FIG. 8, the grid wiring lines wj forming the first upper layer electrode JET and the second upper layer electrode JE2 may be configured to be inclined (for example, 45° and 135° respect to the scanning signal line GL. The first upper layer electrode JE1 and the second upper layer wiring line electrode JE2 are both sensing electrodes and are adjacent in a direction that is parallel or orthogonal to the scanning signal line GL. The lower layer electrode KE, is a shield electrode.

In FIG. 8, the first protrusion Jx1 protruding from the first wiring line JL1, which is an end portion of the first upper layer electrode JE1, toward the second upper layer electrode JE2 and the second protrusion Jx2 protruding from the second wiring line JL2, which is an end portion of the second upper layer electrode JE2, toward the first upper layer electrode JE1 face each other with the gap Q therebetween, and a wide portion Kh that overlaps with the gap Q is provided in the lower layer electrode KE. Accordingly, a short circuit between the first upper layer electrode JE1, which is a sensing electrode, and the second upper layer electrode JE2, which is the sensing electrode, can be prevented.

Second Embodiment

Figure 9:
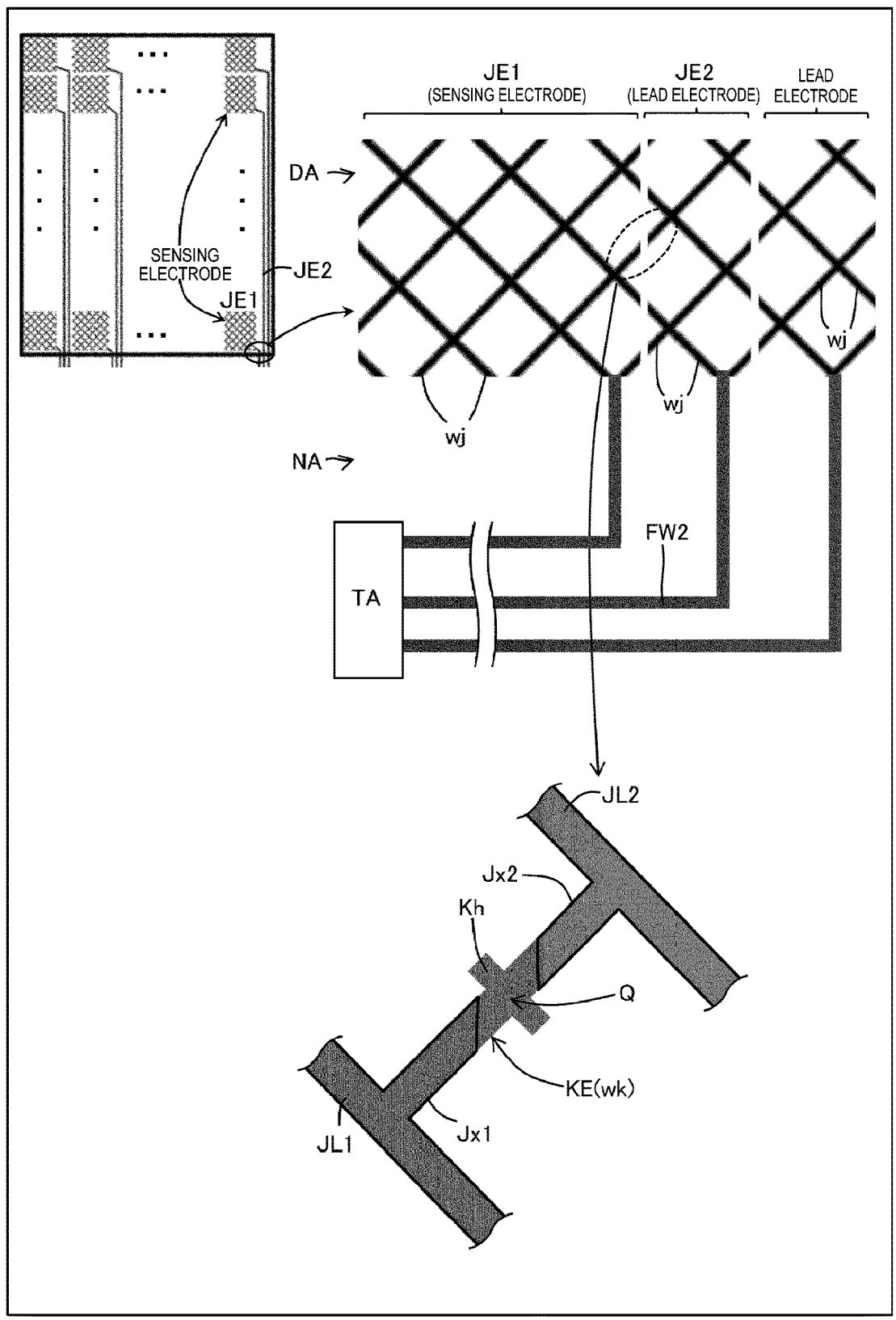
FIG. 9 is an explanatory diagram illustrating a display device according to a second embodiment.

FIG. 9 is an explanatory diagram illustrating a display device according to a second embodiment. In the first embodiment, a configuration has been described in which the first upper layer electrode JE1 and the second upper layer eletrode JE2 are sensing electrodes, but the configuration is not limited thereto. As illustrated in FIG. 9, the first upper layer electrode JE1 may be a sensing electrode, the second upper layer electrode JE2 may be a lead electrode, and the lower layer electrode KE may be a shield electrode. The second upper layer electrode JE2 is a mesh electrode, and in the display region DA, is formed from the grid wiring line wj having a uniform line width. The second upper layer electrode JE2, which is a lead electrode, is connected at one end to the sensing electrode, and is connected at the other end to the terminal section TA formed in the thin film transistor 4 via a lead wiring line FW2 of the frame region NA.

In FIG. 9, the first protrusion Jx1 protruding from the first wiring line JL1, which is an end portion of the first upper layer electrode JE1, toward the second upper layer electrode JE2 and the second protrusion Jx2 protruding from the second wiring line JL2, which is an end portion of the second upper layer electrode JE2, toward the first upper layer electrode JE1 face each other with the gap Q therebetween, and the wide portion Kh that overlaps with the gap Q is provided in the lower layer electrode KE. Accordingly, a short circuit between the first upper layer electrode JE1, which is a sensing electrode, and the second upper layer electrode JE2, which is a lead electrode, can be prevented.

Third Embodiment

Figure 10:
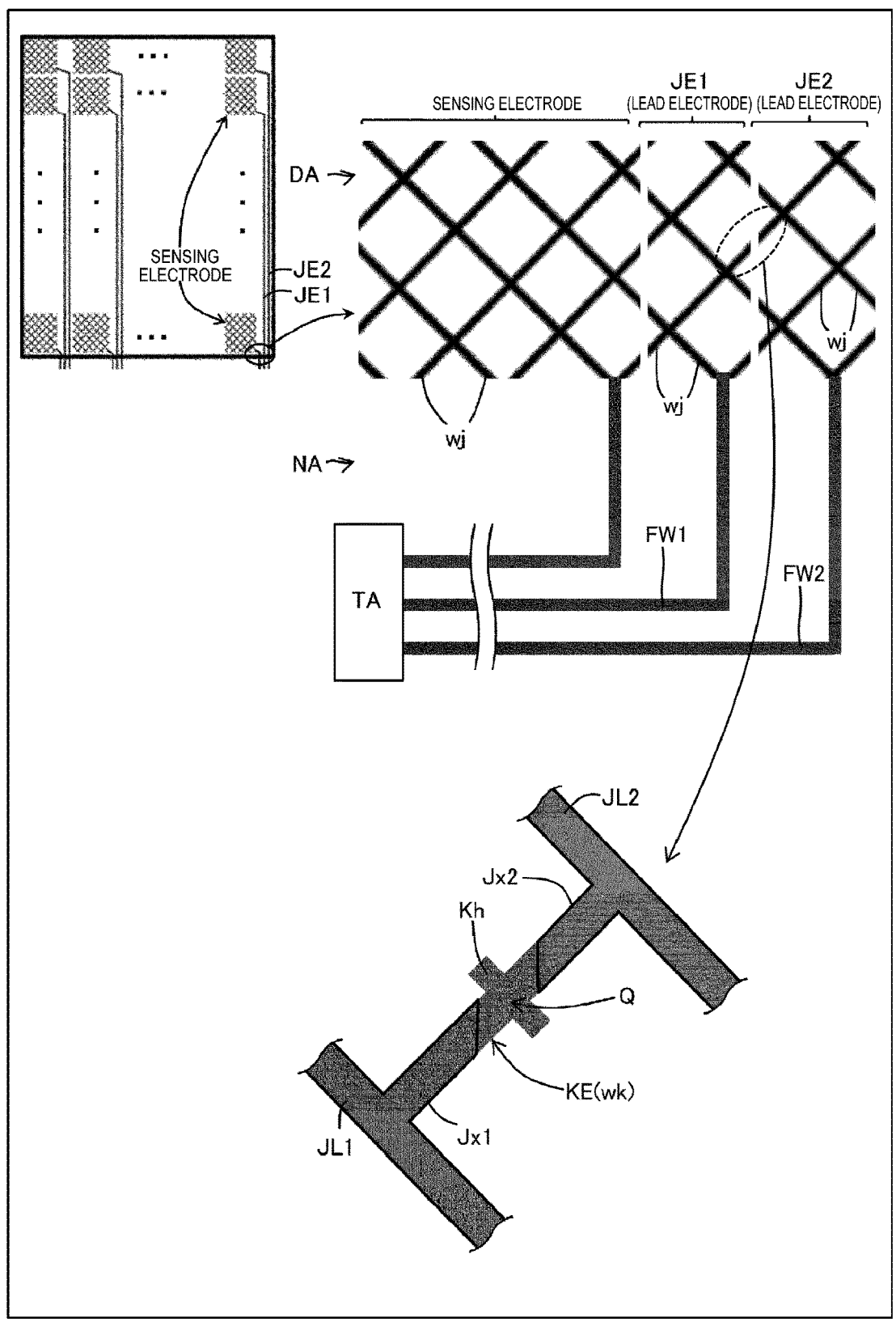
FIG. 10 is an explanatory diagram illustrating a display device according to a third embodiment.

FIG. 10 is an explanatory diagram illustrating a display device according to a third embodiment. In FIG. 10, the first upper layer electrode JE1 and the second upper layer electrode JE2 are both lead electrodes, and the lower layer electrode KE is a shield electrode. The first upper layer electrode JE1 and the second upper layer electrode JE2 are both mesh electrodes, and in the display region DA, is formed from a grid wiring line wj having a uniform line width. The first upper layer electrode JE1, which is a lead electrode, is connected at one end to the sensing electrode, and is connected at the other end to the terminal section TA via a lead wiring line FW1 of the frame region NA. The second upper layer electrode JE2, which is a lead electrode, is connected at one end to the sensing electrode, and is connected at the other end to the terminal section TA via the lead wiring line FW2 of the frame region NA.

In FIG. 10, the first protrusion Jx1 protruding from the first wiring line JL1, which is an end portion of the first upper layer electrode JE1, toward the second upper layer electrode JE2 and the second protrusion Jx2 protruding from the second wiring line JL2, which is an end portion of the second upper layer electrode JE2, toward the first upper layer electrode JE1 face each other with the gap Q therebetween, and the wide portion Kh that overlaps with the gap Q is provided in the lower layer electrode KE. Accordingly, a short circuit between the first upper layer electrode JE1, which is a lead electrode, and the second upper layer electrode JE2, which is a lead electrode, can be prevented.

Fourth Embodiment

Figure 11:
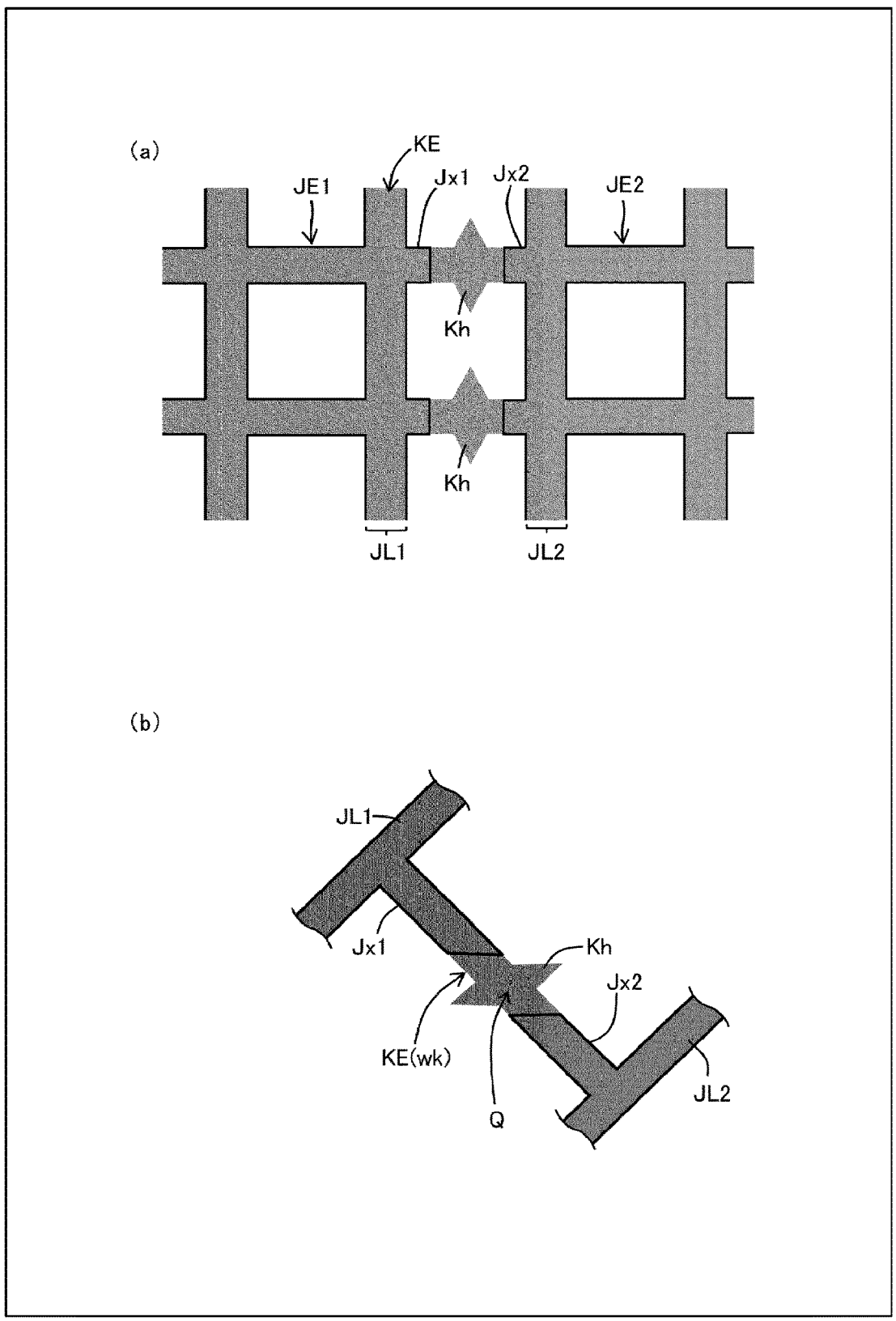
FIG. 11 illustrates plan views illustrating a display device according to a fourth embodiment.

FIG. 11 illustrates plan views illustrating a display device according to a fourth embodiment. In the first, second, and third embodiment, the wide portion Kh has a rectangle shape, but is not limited thereto. As illustrated in FIGS. 11(a) and (b), the wide portion Kh may be configured to have a shape with an acute angle in plan view to make the metal residue be easily cut.

Fifth Embodiment

Figure 12:
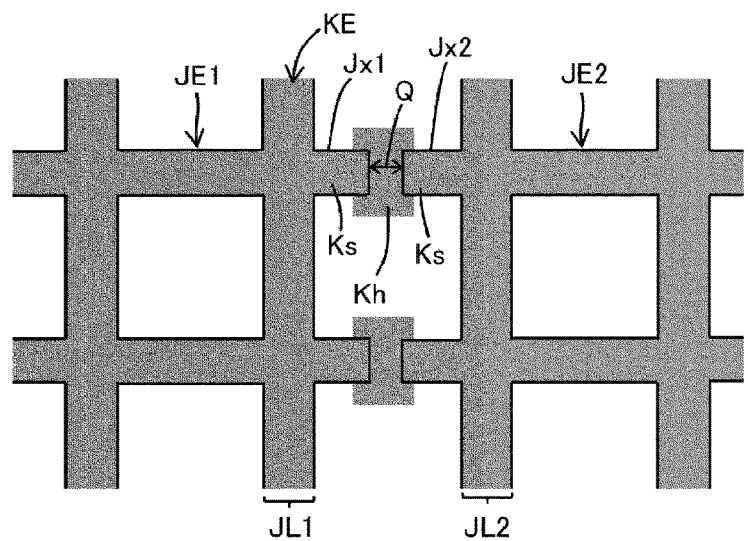
FIG. 12 illustrates plan views illustrating a display device according to a fifth embodiment.
Figure 12:
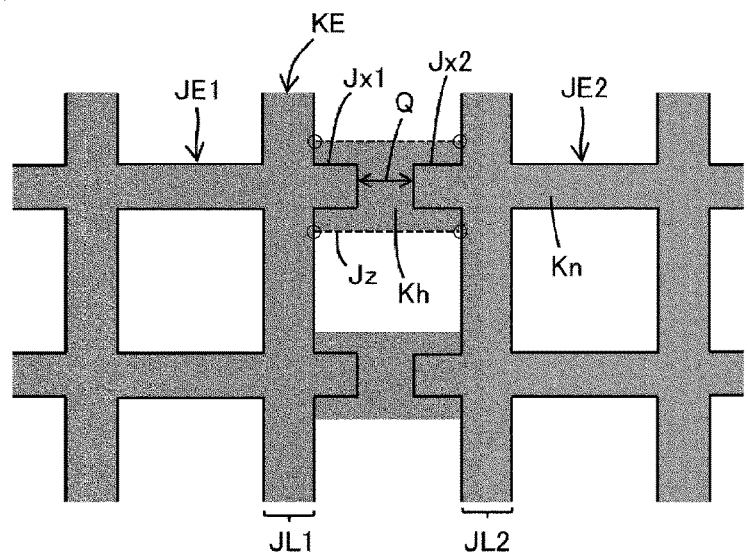

FIG. 12 illustrates plan views illustrating a display device according to a fifth embodiment. In the first, second, third, and fourth embodiment, a configuration has been described in which the wide portion Kh of the lower layer electrode KE is positioned at the gap Q between the first protrusion Jx1 and the second protrusion Jx2 in plan view, but is not limited thereto. As illustrated in FIG. 12(a), the wide portion Kh may be configured to overlap with the first protrusion Jx1 and the second protrusion Jx2.

In the configuration of FIG. 12(a), a metal residue leading to an edge (edge extending in the protruding direction) of the first protrusion Jx1 and a metal residue leading to an edge (edge extending in the protruding direction) of the second protrusion Jx2 are cut at a portion along an edge of the wide portion Kh, and the metal residues thereof are no longer electrically connected. This allows the prevention of short-circuiting of the first upper layer electrode JE1 and the second upper layer electrode JE2.

Also, as illustrated in FIG. 12(b), the wide portion Kh may be configured to overlap with an entirety of the first protrusion Jx1 and an entirety of the second protrusion Jx2. In the configuration of FIG. 12(b), a leak path between the first wiring line JL1 and the second wiring line JL2 can be longer than that of the comparative example in FIG. 6, and thus the short circuit ratio of the first upper layer electrode JE1 and the second upper layer electrode JE2 can be reduced. Note that the metal residue of the edge of the first wiring line JL1 and the metal residue of the edge of the second wiring line JL2 can also be expected to be cut at an intersection portion (a portion surrounded by a circle in the drawing) with the wide portion Kh in plan view, and in this case, the metal residue of the edge of the first wiring line JL1 and the metal residue of the edge of the second wiring line JL2 are not electrically connected via a metal residue (dotted line) along the edge of the wide portion Kh.

Sixth Embodiment

Figure 13:
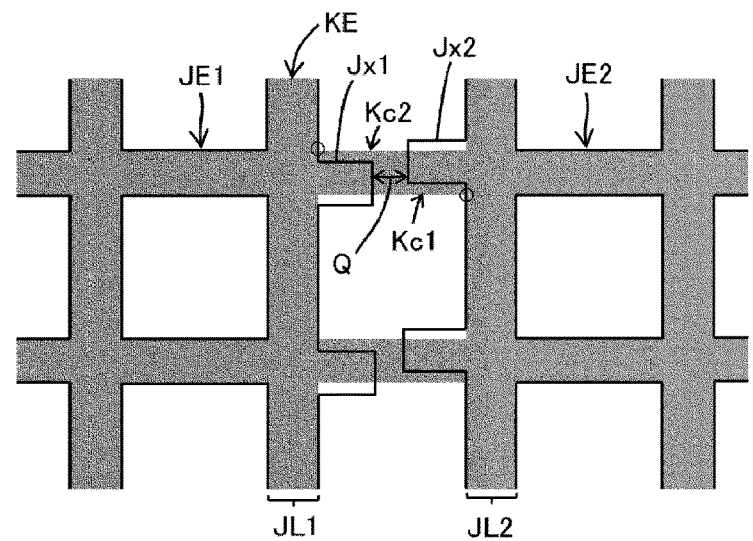
FIG. 13 illustrates plan views illustrating a display device according to a sixth embodiment.
Figure 13:
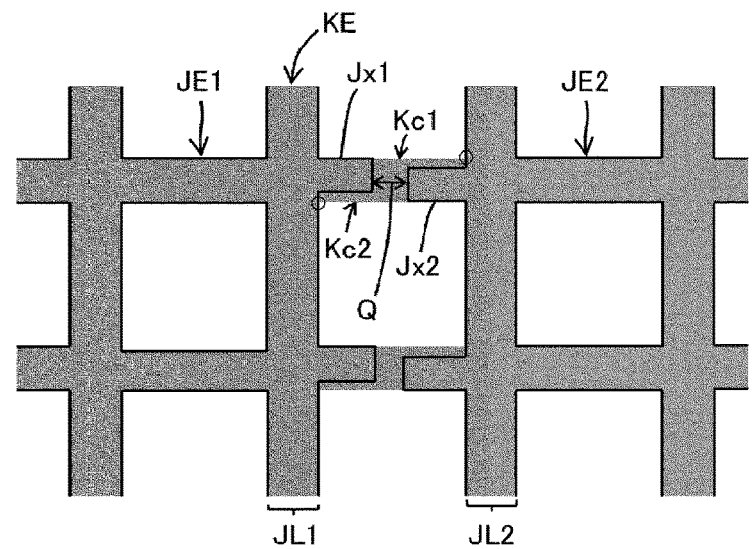

FIG. 13 illustrates plan views illustrating a display device according to a sixth embodiment. In FIG. 13, the first upper layer electrode JE1 includes the first protrusion Jx1 protruding toward the second upper layer electrode JE2, the second upper layer electrode JE2 includes the second protrusion Jx2 protruding toward the first upper layer electrode JE1, the first protrusion Jx1 and the second protrusion Jx2 face each other with the gap Q therebetween, and the lower layer electrode KE includes a first side face Kc1 that overlaps with the first protrusion Jx1 and does not overlap with the second protrusion Jx2, and a second side face Kc2 that overlaps with the second protrusion Jx2 and does not overlap with the first protrusion Jx1.

In the sixth embodiment, each of a leak path between the first wiring line JL1 and the second protrusion Jx2 and a leak path between the second wiring line JL2 and the first protrusion Jx1 can be longer than that of the comparative example in FIG. 6, and thus the short circuit ratio of the first upper layer electrode JE1 and the second upper layer electrode JE2 can be reduced. Note that the metal residue formed along the first side face Kc1 can also be expected to be cut at an intersection portion (a portion surrounded by a circle in the drawing) of the second wiring line JL2 without leading to the second protrusion Jx2. Also, the metal residue formed along the second side face Kc2 can also be expected to be cut at an intersection portion (a portion surrounded by a circle in the drawing) of the first wiring line JL1 without leading to the first protrusion Jx1.

In the sixth embodiment, as illustrated in FIG. 13(a), the first side face Kc1 may be offset in the vertical direction in the drawing (direction orthogonal to the projecting direction) with respect to both edges of the first protrusion Jx1, and the second side face Kc2 may be offset in the vertical direction in the drawing with respect to both edges of the second protrusion Jx2, or as illustrated in FIG. 13(b), the first side surface Kc1 may be configured to match with one of edges of the first protrusion Jx1, and the second side face Kc2 may be configured to match with one of edges of the second protrusion Jx2. In the configuration of FIG. 13(b), an entirety of the first protrusion Jx1 and an entirety of the second protrusion Jx2 overlap with the lower layer electrode KE, which is a shield electrode, and thus has excellent shielding characteristics.

In the sixth embodiment, the first upper layer electrode JE1 and the second upper layer electrode JE2 may be sensing electrodes, or the first upper layer electrode JE1 may be a sensing electrode and the second upper layer electrode JE2 may be a lead electrode. Additionally, the first upper layer electrode JE1 and the second upper layer electrode JE2 may be lead electrodes.

The embodiments described above are for the purpose of illustration and description and are not intended to be limiting. It will be apparent to those skilled in the art that many variations will be possible in accordance with these examples and descriptions.

Supplement

First Aspect

A display device including:
a thin film transistor layer;
a light-emitting element including a first electrode, a function layer, and a second electrode;
a sealing layer; and
a touch panel layer including a lower layer electrode and a plurality of upper layer electrodes,
wherein the plurality of upper layer electrodes include a first upper layer electrode and a second upper layer electrode adjacent to the first upper layer electrode and electrically separated from the first upper layer electrode,
the lower layer electrode is provided in common with the first upper layer electrode and the second upper layer electrode and overlaps with the first upper layer electrode and the second upper layer electrode via an insulating film,
the first upper layer electrode includes a first protrusion protruding toward the second upper layer electrode, and the second upper layer electrode includes a second protrusion protruding toward the first upper layer electrode,
the first protrusion and the second protrusion face each other with a gap therebetween, and
the lower layer electrode is provided with a wide portion having a width greater than those of the first protrusion and the second protrusion, the wide portion overlapping at least with the gap.

Second Aspect

A display device including:
a thin film transistor layer;
a light-emitting element including a first electrode, a function layer, and a second electrode;
a sealing layer; and
a touch panel layer including a lower layer electrode and a plurality of upper layer electrodes,
wherein the plurality of upper layer electrodes include a first upper layer electrode and a second upper layer electrode adjacent to the first upper layer electrode and electrically separated from the first upper layer electrode,
the lower layer electrode is provided in common with the first upper layer electrode and the second upper layer electrode and overlaps with the first upper layer electrode and the second upper layer electrode via an insulating film, the first upper layer electrode includes a first protrusion protruding toward the second upper layer electrode, and the second upper layer electrode includes a second protrusion protruding toward the first upper layer electrode, the first protrusion and the second protrusion facing each other with a gap therebetween, and the lower layer electrode includes a first side face overlapping with the first protrusion and not overlapping with the second protrusion and a second side face overlapping with the second protrusion and not overlapping with the first protrusion.

Third Aspect

The display device, for example, according to Second Aspect, wherein the lower layer electrode includes a portion which is located below the gap and having an identical width to those of the first protrusion and the second protrusion.

Fourth Aspect

The display device, for example, according to First Aspect, wherein the lower layer electrode includes a reference portion having an identical width to those of the first protrusion and the second protrusion, and both the first protrusion and the second protrusion overlap with the reference portion.

Fifth Aspect

The display device, for example, according to First Aspect, wherein the wide portion is located at the gap in plan view.

Sixth Aspect

The display device, for example, according to First Aspect, wherein the wide portion overlaps with the first protrusion and the second protrusion.

Seventh Aspect

The display device, for example, according to Sixth Aspect, wherein the wide portion overlaps with an entirety of the first protrusion and an entirety of the second protrusion.

Eighth Aspect

The display device, for example, according to any one of First Aspect to Seventh Aspect, wherein the lower layer electrode is formed from a grid wiring line, and the first upper layer electrode and the second upper layer electrode are formed from grid wiring lines overlapping with the lower layer electrode.

Ninth Aspect

The display device, for example, according to Eighth Aspect, wherein the lower layer electrode includes one grid corresponding to one subpixel.

Tenth Aspect

The display device, for example, according to any one of First Aspect to Ninth Aspect, wherein the first electrode includes an edge covered with an edge cover film, the edge cover film includes an opening exposing an upper face of the first electrode, and the first upper layer electrode and the second upper layer electrode do not overlap with the opening.

Eleventh Aspect

The display device, for example, according to any one of First Aspect to Tenth Aspect, wherein each of the first upper layer electrode and the second upper layer electrode is provided in common with a plurality of subpixels.

Twelfth Aspect

The display device, for example, according to First Aspect, wherein the first electrode includes an edge covered with an edge cover film, the edge cover film includes an opening exposing an upper face of the first electrode, the first upper layer electrode and the second upper layer electrode do not overlap with the opening, and the wide portion overlaps with the opening.

Thirteenth Aspect

The display device, for example, according to Eighth Aspect, wherein the lower layer electrode functions as a shield electrode in the touch panel layer.

Fourteenth Aspect

The display device, for example, according to Thirteenth Aspect, wherein the first upper layer electrode includes a first wiring line, and the second upper layer electrode includes a second wiring line, the first wiring line and the second wiring line extending in an identical direction and facing each other, and the first protrusion protrudes from the first wiring line, and the second protrusion protrudes from the second wiring line.

Fifteenth Aspect

The display device, for example, according to Thirteenth Aspect, wherein the first upper layer electrode and the second upper layer electrode function as sensing electrodes in the touch panel layer.

Sixteenth Aspect

The display device, for example, according to any one of First Aspect to Fifteenth Aspect, wherein the first upper layer electrode is any one of a layered film including titanium and aluminum, a single-layer film of molybdenum, and a single-layer film of titanium, the second upper layer electrode is any one of a layered film including titanium and aluminum, a single-layer film of molybdenum, and a single-layer film of titanium, and the lower layer electrode is any one of a layered film including titanium and aluminum, a single-layer film of molybdenum, and a single-layer film of titanium.

Seventeenth Aspect

The display device, for example, according to Thirteenth Aspect, further including a terminal section in a frame region surrounding a display region, wherein the terminal section is connected to a sensing electrode via a lead electrode, and the first upper layer electrode functions as a sensing electrode and the second upper layer electrode functions as a lead electrode in the touch panel layer.

Eighteenth Aspect

The display device, for example, according to Thirteenth Aspect, further including a terminal section in a frame region surrounding a display region, wherein the terminal section is connected to a sensing electrode via a lead electrode, and each of the first upper layer electrode and the second upper layer electrode functions as a lead electrode in the touch panel layer.

Nineteenth Aspect

The display device, for example, according to any one of First Aspect to Eighteenth Aspect, wherein the first protrusion and the second protrusion have a protruding direction inclined with respect to an extending direction of a scanning signal line provided in the thin film transistor layer.

The invention claimed is:
1. A display device comprising:
a thin film transistor layer;
a light-emitting element including a first electrode, a function layer, and a second electrode;
a sealing layer; and
a touch panel layer including a lower layer electrode and a plurality of upper layer electrodes,
wherein the plurality of upper layer electrodes include a first upper layer electrode and a second upper layer electrode adjacent to the first upper layer electrode and electrically separated from the first upper layer electrode,
the lower layer electrode is provided in common with the first upper layer electrode and the second upper layer electrode and overlaps with the first upper layer electrode and the second upper layer electrode via an insulating film,
the first upper layer electrode includes a first protrusion protruding toward the second upper layer electrode, and the second upper layer electrode includes a second protrusion protruding toward the first upper layer electrode,
the first protrusion and the second protrusion face each other with a gap therebetween, and
the lower layer electrode is provided with a wide portion having a width greater than those of the first protrusion and the second protrusion, the wide portion overlapping at least with the gap.

2. A display device comprising:
a thin film transistor layer;
a light-emitting element including a first electrode, a function layer, and a second electrode;
a sealing layer; and
a touch panel layer including a lower layer electrode and a plurality of upper layer electrodes,
wherein the plurality of upper layer electrodes include a first upper layer electrode and a second upper layer electrode adjacent to the first upper layer electrode and electrically separated from the first upper layer electrode,
the lower layer electrode is provided in common with the first upper layer electrode and the second upper layer electrode and overlaps with the first upper layer electrode and the second upper layer electrode via an insulating film,
the first upper layer electrode includes a first protrusion protruding toward the second upper layer electrode, and the second upper layer electrode includes a second protrusion protruding toward the first upper layer electrode, the first protrusion and the second protrusion facing each other with a gap therebetween, and
the lower layer electrode includes a first side face overlapping with the first protrusion and not overlapping with the second protrusion and a second side face overlapping with the second protrusion and not overlapping with the first protrusion.

3. The display device according to claim 2,
wherein the lower layer electrode includes a portion which is located below the gap and having an identical width to those of the first protrusion and the second protrusion.

4. The display device according to claim 1,
wherein the lower layer electrode includes a reference portion having an identical width to those of the first protrusion and the second protrusion, and
both the first protrusion and the second protrusion overlap with the reference portion.

5. The display device according to claim 1,
wherein the wide portion is located at the gap in plan view.

6. The display device according to claim 1,
wherein the wide portion overlaps with the first protrusion and the second protrusion.

7. The display device according to claim 6,
wherein the wide portion overlaps with an entirety of the first protrusion and an entirety of the second protrusion.

8. The display device according to claim 1,
wherein the lower layer electrode is formed from a grid wiring line, and
the first upper layer electrode and the second upper layer electrode are formed from grid wiring lines overlapping with the lower layer electrode.

9. The display device according to claim 8,
wherein the lower layer electrode includes one grid corresponding to one subpixel.

10. The display device according to claim 1,
wherein the first electrode includes an edge covered with an edge cover film,
the edge cover film includes an opening exposing an upper face of the first electrode, and
the first upper layer electrode and the second upper layer electrode do not overlap with the opening.

11. The display device according to claim 1,
wherein each of the first upper layer electrode and the second upper layer electrode is provided in common with a plurality of subpixels.

12. The display device according to claim 1,
wherein the first electrode includes an edge covered with an edge cover film,
the edge cover film includes an opening exposing an upper face of the first electrode,
the first upper layer electrode and the second upper layer electrode do not overlap with the opening, and
the wide portion overlaps with the opening.

13. The display device according to claim 8,
wherein the lower layer electrode functions as a shield electrode in the touch panel layer.

14. The display device according to claim 13,
wherein the first upper layer electrode includes a first wiring line, and the second upper layer electrode includes a second wiring line, the first wiring line and the second wiring line extending in an identical direction and facing each other, and
the first protrusion protrudes from the first wiring line, and the second protrusion protrudes from the second wiring line.

15. The display device according to claim 13,
wherein the first upper layer electrode and the second upper layer electrode function as sensing electrodes in the touch panel layer.

16. The display device according to claim 1,
wherein the first upper layer electrode is any one of a layered film including titanium and aluminum, a single-layer film of molybdenum, and a single-layer film of titanium, the second upper layer electrode is any one of a layered film including titanium and aluminum, a single-layer film of molybdenum, and a single-layer film of titanium, and the lower layer electrode is any one of a layered film including titanium and aluminum, a single-layer film of molybdenum, and a single-layer film of titanium.

17. The display device according to claim 13, further comprising:

a terminal section in a frame region surrounding a display region, wherein the terminal section is connected to a sensing electrode via a lead electrode, and the first upper layer electrode functions as a sensing electrode and the second upper layer electrode functions as a lead electrode in the touch panel layer.

18. The display device according to claim 13, further comprising:

a terminal section in a frame region surrounding a display region, wherein the terminal section is connected to a sensing electrode via a lead electrode, and each of the first upper layer electrode and the second upper layer electrode functions as a lead electrode in the touch panel layer.

19. The display device according to claim 1, wherein the first protrusion and the second protrusion have a protruding direction inclined with respect to an extending direction of a scanning signal line provided in the thin film transistor layer.

* * * * *